United States Patent
Shi et al.

(10) Patent No.: US 8,315,065 B2
(45) Date of Patent: Nov. 20, 2012

(54) SELF-LOCKING FEATURES IN A MULTI-CHIP MODULE

(75) Inventors: Jing Shi, Carlsbad, CA (US); Hiren D. Thacker, San Diego, CA (US); Ashok V. Krishnamoorthy, San Diego, CA (US)

(73) Assignee: Oracle America, Inc., Redwood Shores, CA (US)

( * ) Notice: Subject to any disclaimer, the term of this patent is extended or adjusted under 35 U.S.C. 154(b) by 442 days.

(21) Appl. No.: 12/568,017

(22) Filed: Sep. 28, 2009

(65) Prior Publication Data

US 2011/0075380 A1    Mar. 31, 2011

(51) Int. Cl.
*H05K 7/02* (2006.01)
*H05K 7/06* (2006.01)
*H05K 7/08* (2006.01)
*H05K 7/10* (2006.01)

(52) U.S. Cl. ........ 361/779; 361/772; 361/773; 361/774; 361/776

(58) Field of Classification Search .......... 361/770–774, 361/776–779, 803, 792; 439/65–66; 324/754–755
See application file for complete search history.

(56) References Cited

U.S. PATENT DOCUMENTS

| | | | | |
|---|---|---|---|---|
| 5,829,988 | A * | 11/1998 | McMillan et al. | 439/70 |
| 6,232,149 | B1 * | 5/2001 | Dozier et al. | 438/117 |
| 6,690,186 | B2 * | 2/2004 | Fjelstad | 324/756.03 |

* cited by examiner

*Primary Examiner* — Tuan T Dinh
(74) *Attorney, Agent, or Firm* — Park, Vaughan, Fleming & Dowler LLP; Steven E Stupp

(57) ABSTRACT

A multi-chip module (MCM) is described. This MCM includes at least two substrates that are remateably mechanically coupled by positive and negative features on facing surfaces of the substrates. These positive and negative features may mate and self-lock with each other. For example, the positive features on one of the surfaces may include pairs of counterposed micro-springs, and the negative features may include pits or grooves on the other surface. When the substrates are mechanically coupled, a given pair of positive features may provide a force in a plane of the other surface. Furthermore, by compressing the MCM so that the surfaces of the substrates are pushed toward each other, the mechanical coupling may be released.

17 Claims, 14 Drawing Sheets

```
                                                               ┌─ 1000
  ┌─────────────────────────────────────────────────────────────┐
  │   DEFINE FIRST NEGATIVE FEATURES ON A FIRST SURFACE OF A FIRST │
  │   SUBSTRATE, WHERE A GIVEN FIRST NEGATIVE FEATURE IS RECESSED  │
  │   BELOW THE FIRST SURFACE AND HAS AN OPENING, DEFINED BY AN EDGE │
  │                              1010                              │
  └─────────────────────────────────────────────────────────────┘
                                  │
                                  ▼
  ┌─────────────────────────────────────────────────────────────┐
  │   DEFINE FIRST POSITIVE FEATURES ON A SECOND SURFACE OF A SECOND │
  │   SUBSTRATE, WHERE A GIVEN FIRST POSITIVE FEATURE PROTRUDES ABOVE │
  │   THE SECOND SURFACE, AND WHERE THE FIRST POSITIVE FEATURES ARE │
  │   CONFIGURED TO MATE AND SELF-LOCK WITH THE FIRST NEGATIVE      │
  │                            FEATURES                            │
  │                              1012                              │
  └─────────────────────────────────────────────────────────────┘
                                  │
                                  ▼
  ┌─────────────────────────────────────────────────────────────┐
  │   MECHANICALLY COUPLE THE FIRST SUBSTRATE TO THE SECOND        │
  │   SUBSTRATE IN AN MCM BY POSITIONING THE FIRST SUBSTRATE AND THE │
  │   SECOND SUBSTRATE SO THAT THE FIRST SURFACE FACES THE SECOND  │
  │   SURFACE, AND BY COMPRESSING THE MCM SO THAT THE FIRST SURFACE │
  │   AND THE SECOND SURFACE ARE PUSHED TOWARD EACH OTHER, AND THE │
  │   FIRST POSITIVE FEATURES MATE AND SELF-LOCK WITH ASSOCIATED   │
  │                       NEGATIVE FEATURES                        │
  │                              1014                              │
  └─────────────────────────────────────────────────────────────┘
```

FIG. 10

SELF-LOCKING FEATURES IN A MULTI-CHIP MODULE

GOVERNMENT LICENSE RIGHTS

The United States Government has a paid-up license in this invention and the right in limited circumstances to require the patent owner to license others on reasonable terms as provided for by the terms of Agreement No. HR0011-08-9-0001 awarded by the Defense Advanced Research Projects Administration.

BACKGROUND

1. Field

The present disclosure generally relates to multi-chip modules (MCMs) and techniques for fabricating MCMs. More specifically, the present disclosure relates to an MCM that includes substrates with positive and negative features that mate and self-lock, thereby mechanically coupling the substrates.

2. Related Art

Wire bonding and solder-ball flip-chip bonding are widely used in electronic packages to produce first-level or chip-to-substrate interconnects. With the recent emergence of multi-chip modules (MCMs) which use large-area substrates, there is increasing interest in remateable interconnects between chips and a ceramic substrate to address the so-called 'known-good-die issue.' Additionally, chips are often fully tested prior to assembly of an MCM because it is expensive to replace the ceramic substrates in the MCM in the event of a bad or faulty chip. However, such rigorous testing prior to assembly increases the cost of the MCM.

Stressed-metal springs or claws (which are sometimes referred to as 'micro-springs') are promising candidates for use in remateable chip-to-package interconnects. In particular, micro-spring interconnects offer low-resistance electrical contacts even after multiple engage-disengage cycles. FIG. 1 presents a block diagram illustrating an existing micro-spring connector 100, which can be fabricated by etching a sacrificial layer on a substrate to release a stressed-metal film.

When a micro-spring is deformed (for example, when it is compressed), there is a natural tendency for the micro-spring to return to its original stress-free state. As a consequence, a locking mechanism is often used to keep micro-springs compressed and in good contact with contact pads in an MCM at a designed compression height and alignment. For example, as shown in FIG. 2A, which illustrates an existing MCM 200, a chip and a ceramic substrate are held in place using an adhesive. Alternatively or additionally, as shown in FIG. 2B, which illustrates an existing MCM 250, an external clamp may be used.

However, while these locking mechanisms are remateable, they are generally incompatible with high-volume manufacturing in the semiconductor industry. In particular, these locking mechanisms often involve manual: alignment, placement and clamping.

Hence, what is needed is an MCM and a fabrication technique without the above-described problems.

SUMMARY

One embodiment of the present disclosure provides a multi-chip module (MCM) that includes: a first substrate having a first surface, and a second substrate having a second surface that faces the first surface. Note that the first substrate includes first negative features disposed on the first surface, where a given first negative feature is recessed below the first surface and has an opening, defined by an edge. Moreover, the second substrate includes first positive features disposed on the second surface, where a given first positive feature protrudes above the second surface. Furthermore, the first positive features are configured to mate and self-lock with the first negative features, thereby mechanically coupling the first substrate and the second substrate.

In some embodiments, the first positive features include micro-spring connectors and/or the first negative features include pits. For example, the first positive features may include counterposed pairs of first positive features that mechanically couple to associated pairs of first negative features. Moreover, mechanical coupling by a given counterposed pair of first positive features may involve a force provided by the given counterposed pair of first positive features in a plane of the first surface.

Note that the mechanical coupling of the first substrate and the second substrate may be remateable. For example, the mechanical coupling of the first substrate and the second substrate may be released by compressing the MCM so that the first surface and the second surface are pushed toward each other.

In some embodiments, the first positive features and the first negative features electrically couple the first substrate and the second substrate. Additionally, in some embodiments the first substrate may include electrical connectors disposed on the first surface, and the second substrate may include second positive features disposed on the second surface, where a given second positive feature protrudes above the second surface. Note that the second positive features may contact the electrical connectors, thereby electrically coupling the first substrate and the second substrate. Alternatively, the second substrate may include the electrical connectors disposed on the second surface, and the first substrate may include the second positive features disposed on the first surface.

In some embodiments, the first negative features are arranged in groups, which include two or more first negative features. Furthermore, the first positive features may be associated with the groups. Consequently, the mechanical coupling may involve mating and self-locking of the given first positive feature with one of the two or more first negative features in a given group, thereby accommodating process variation and misalignment in the MCM.

Note that symmetry directions of the first positive features may be arranged along: a first direction in the plane of the second surface; the first direction and a second direction in the plane of the second surface (where the first direction and the second direction are approximately perpendicular); and/or in radial directions in the plane of the second surface, where the radial directions radiate out from a common point or region on the second surface.

In some embodiments, the first negative features include a mechanically compliant material having a bulk modulus less than a predefined value, thereby facilitating the mechanical coupling. For example, the mechanically compliant material may include a polymer. This mechanically compliant material may facilitate rigid mechanical coupling of the first substrate and the second substrate.

Furthermore, the given first negative feature may include an undercut of the first surface.

In some embodiments, the first substrate includes second positive features disposed on the first surface, where a given second positive feature protrudes above the first surface. Additionally, the second substrate may include second negative features disposed on the second surface, where a given second negative feature is recessed below the second surface and has an opening, defined by an edge. The second positive features may also be associated with the second negative features, and may mate and self-lock with the second negative features, thereby mechanically coupling the first substrate and the second substrate.

Another embodiment provides an MCM in which the first substrate includes first positive features disposed on the first surface, and the second substrate includes second positive features disposed on the second surface. Note that a given positive feature, which can be in the first positive features or the second positive features, protrudes above a given surface, which can be the first surface or the second surface. Furthermore, the first positive features are configured to mate and self-lock with the second positive features, thereby mechanically coupling the first substrate and the second substrate.

Another embodiment provides an electronic device that includes the MCM.

Another embodiment provides a method for fabricating the MCM. During the method, the first negative features are defined on the first surface of the first substrate, where the given first negative feature is recessed below the first surface and has an opening, defined by an edge. Then, the first positive features are defined on the second surface of the second substrate, where the given first positive feature protrudes above the second surface, and where the first positive features are configured to mate and self-lock with the first negative features. Next, the first substrate is mechanically coupled to the second substrate in the MCM by positioning the first substrate and the second substrate so that the first surface faces the second surface, and by compressing the MCM so that the first surface and the second surface are pushed toward each other, and the first positive features mate and self-lock with the associated first negative features. Furthermore, after self-locking, if the first surface and the second surface are pushed toward each other again (i.e., the MCM is compressed), the mechanical coupling of the first substrate and the second substrate may be released.

BRIEF DESCRIPTION OF THE FIGURES

FIG. 10 is a flow chart illustrating a process for fabricating an MCM in accordance with an embodiment of the present disclosure.

Note that like reference numerals refer to corresponding parts throughout the drawings. Moreover, multiple instances of the same type of part are designated by a common prefix separated from an instance number by a dash.

DETAILED DESCRIPTION

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Embodiments of a multi-chip module (MCM), an electronic device that includes the MCM, and a technique for fabricating the MCM are described. This MCM includes at least two substrates that are remateably mechanically coupled by positive and negative features on facing surfaces of the substrates. These positive and negative features may mate and self-lock with each other. For example, the positive features on one of the surfaces may include pairs of counterposed micro-springs, and the negative features may include pits or grooves on the other surface. When the substrates are mechanically coupled, a given pair of positive features may provide a force in a plane of the other surface. Furthermore, by compressing the MCM so that the surfaces of the substrates are pushed toward each other, the mechanical coupling may be released.

This mechanical-coupling technique may be compatible with high-volume manufacturing. In particular, the positive and negative features may be fabricated on the surfaces using semiconductor-process techniques. Therefore, the MCM may be fabricated and assembled without using an external locking mechanism or an adhesive (such as glue), which may reduce the cost of the MCM. For example, because the mechanical coupling is remateable, the MCM can be reworked. In turn, this may reduce the extent of chip testing prior to assembly of the MCM.

In the discussion that follows, remateable mechanical coupling of a chip to a carrier substrate in an MCM (i.e., chip-to-package coupling) is used as an illustrative example. However, the mechanical-coupling technique may be used in a wide variety of applications. Thus, the self-locking positive and negative features may provide remateable or rigid mechanical coupling of arbitrary components, such as interposers.

Figure 3A:
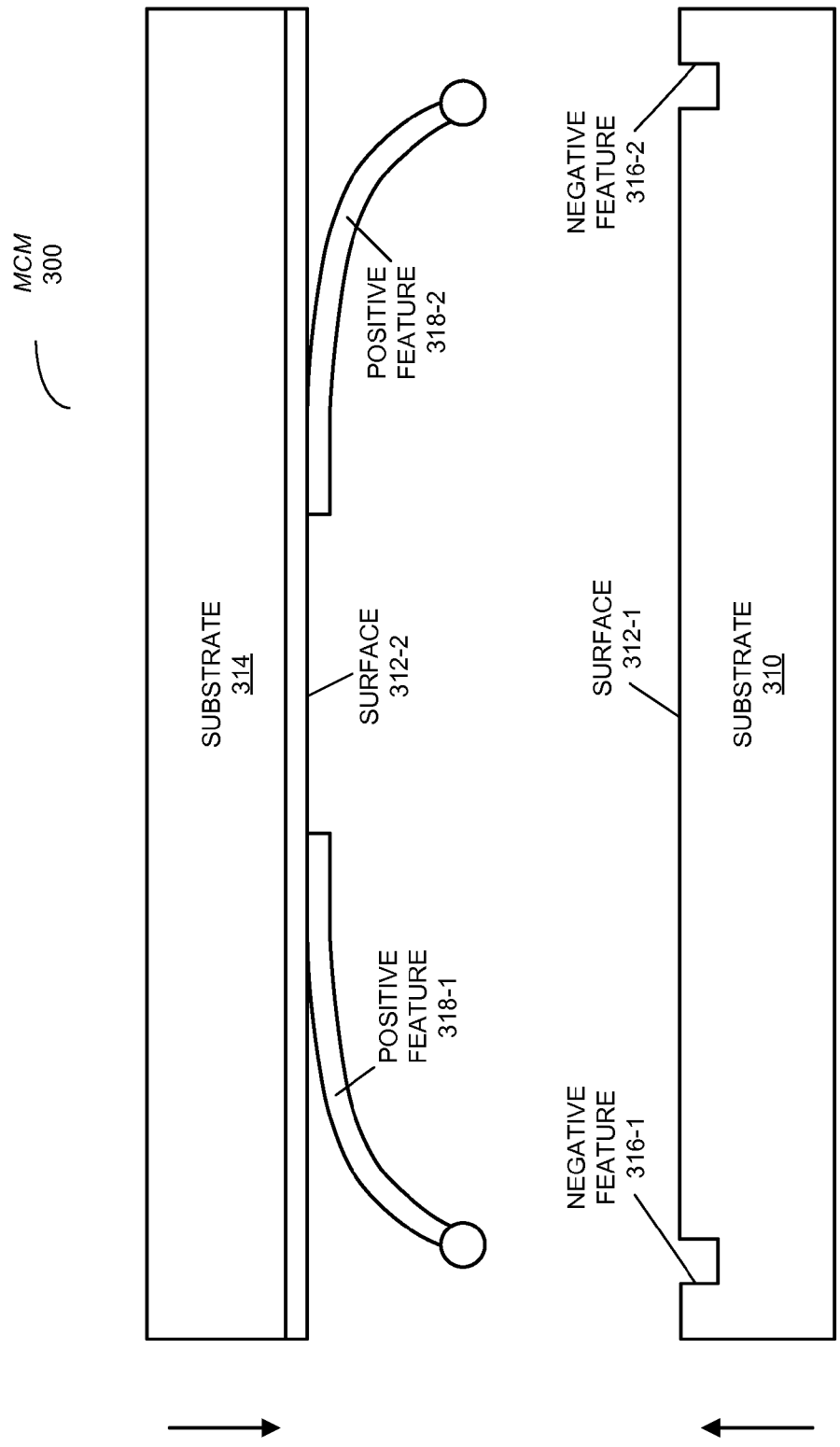
FIG. 3A is a block diagram illustrating an MCM in accordance with an embodiment of the present disclosure.

We now describe embodiments of an MCM. FIG. 3A presents a block diagram illustrating an MCM 300. This MCM includes: a substrate 310 having a surface 312-1, and a substrate 314 having a surface 312-2 that faces surface 312-1. For example, substrate 310 may be a carrier substrate (such as a ceramic substrate), and substrate 314 may be a chip. Alternatively, substrates 310 and 314 may both be chips, or may be other components.

Figure 3B:
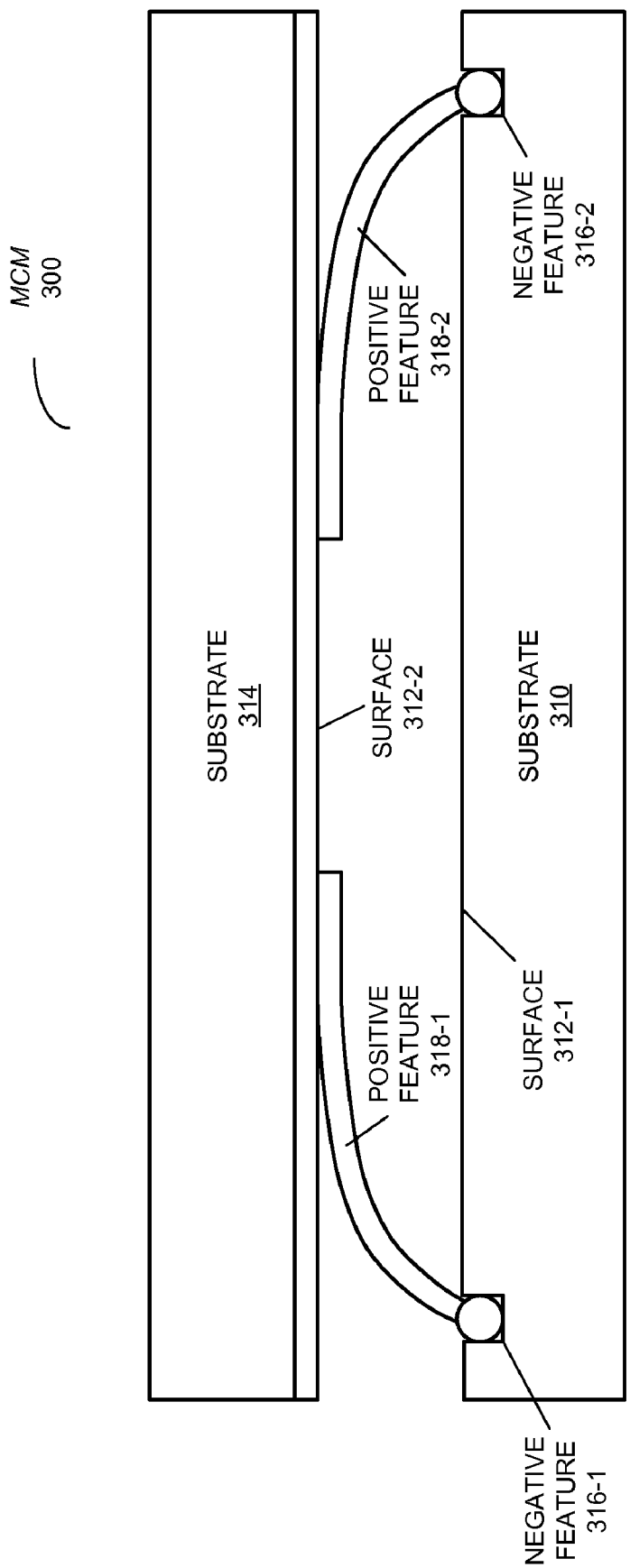
FIG. 3B is a block diagram illustrating an MCM in accordance with an embodiment of the present disclosure.

Substrate 310 may include negative features 316 disposed on surface 312-1, where a given negative feature (such as negative feature 316-1) is recessed below surface 312-1 and has an opening, defined by an edge. Moreover, substrate 314 may include positive features 318 disposed on surface 312-2, where a given positive feature (such as positive feature 318-1) protrudes above surface 312-2. Furthermore, as shown in FIG. 3B, positive features 318 may be configured to mate and self-lock with negative features 316, thereby mechanically coupling substrates 310 and 314. In particular, as shown in FIG. 3B, when surfaces 312 are pressed toward each other a first time, positive features 318 scrub surface 312-1 and fall into negative features 316. Note that, when hundreds or thousands of such features are in place, the self-locking force can be very large. In addition, note that, when positive features 318 and negative features 316 are self-locked, surfaces 312 may be aligned relative to each other.

Figure 1:
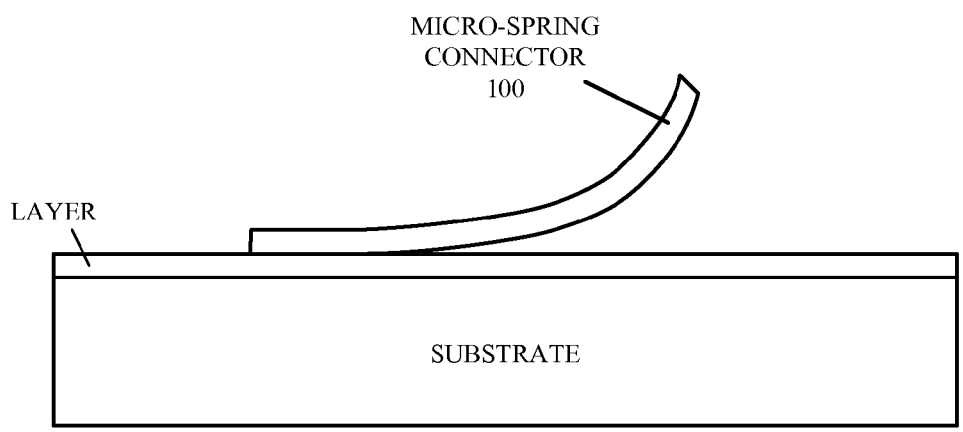
FIG. 1 is a block diagram illustrating an existing microspring connector.
Figure 2A:
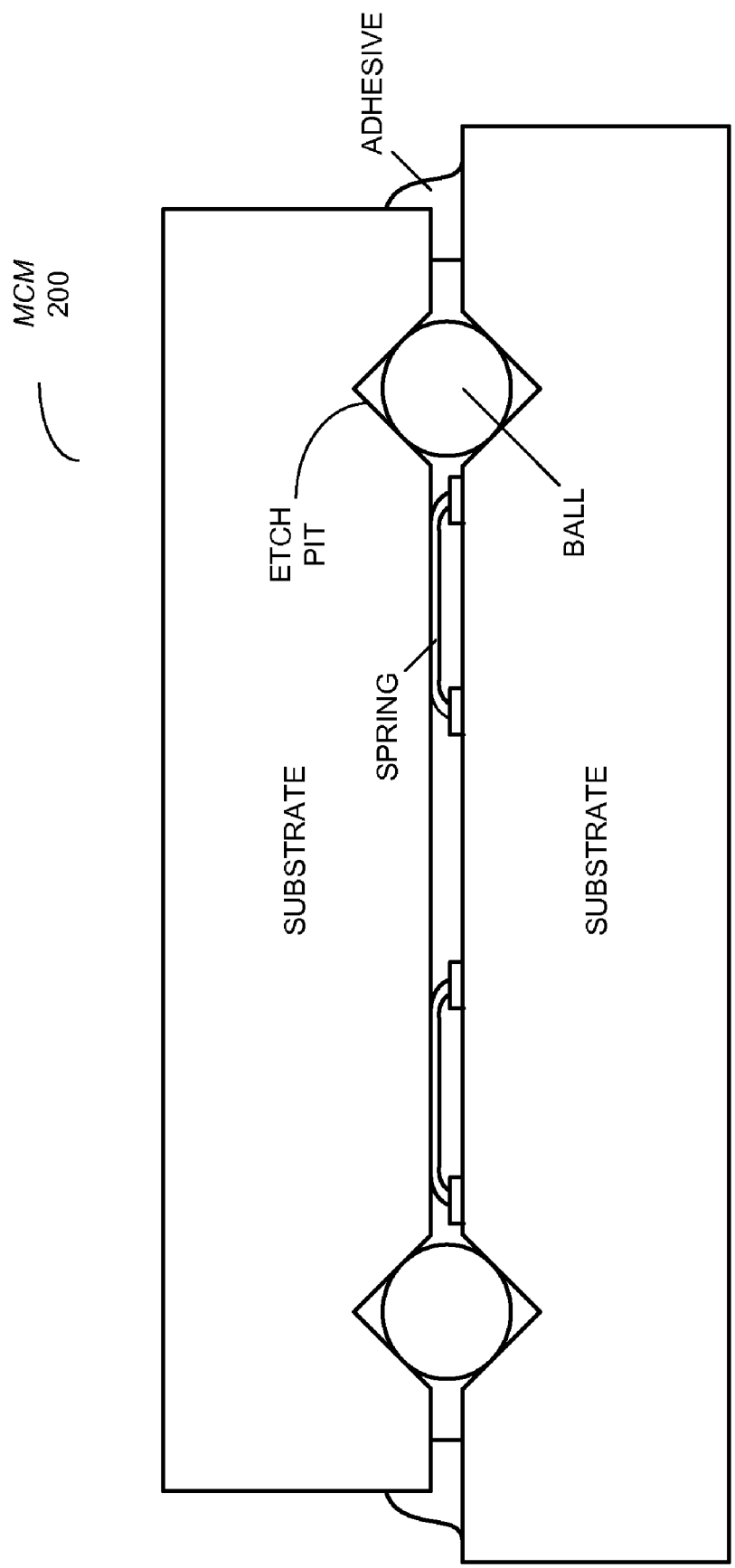
FIG. 2A is a block diagram illustrating an existing multichip module (MCM).
Figure 2B:
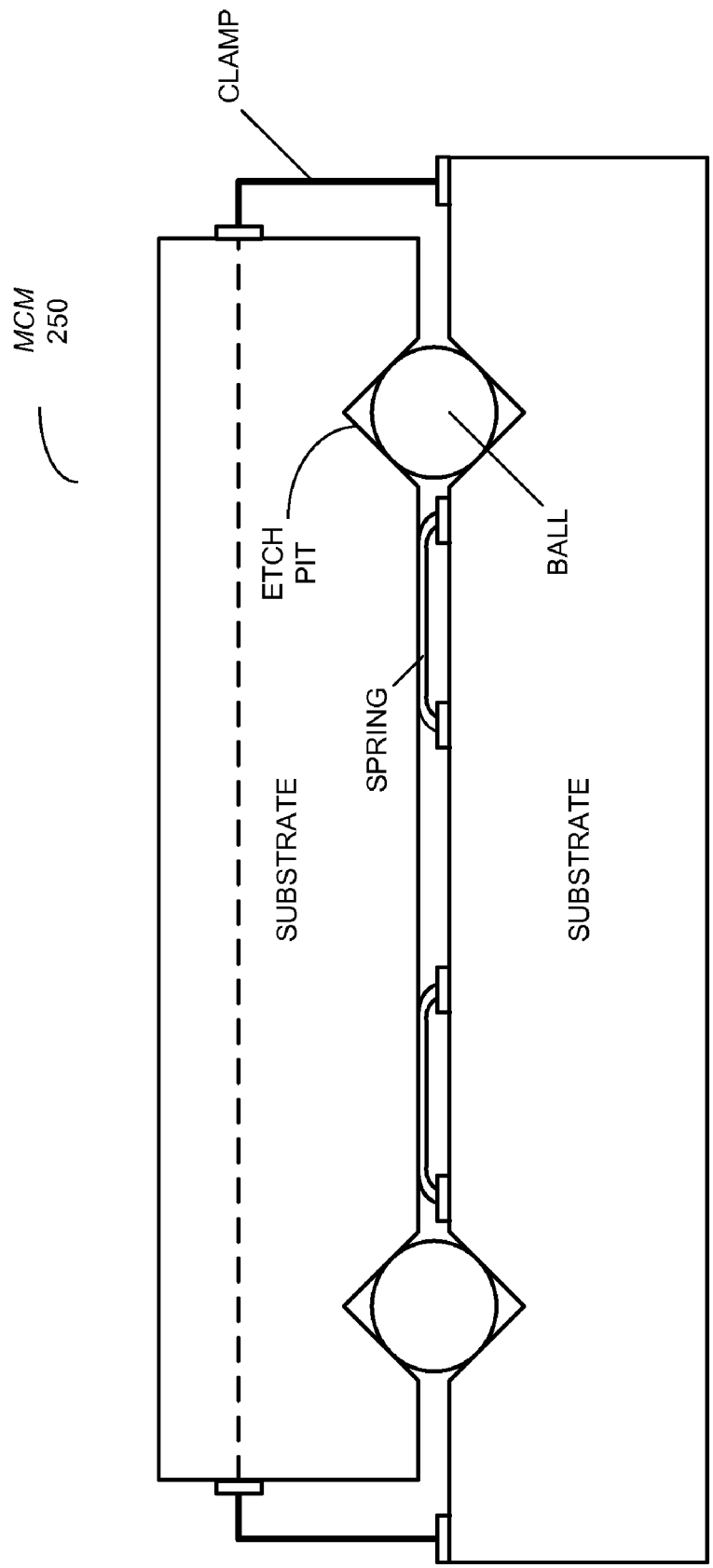
FIG. 2B is a block diagram illustrating an existing MCM.

Positive feature 318 may include micro-spring connectors (such as micro-spring connector 100 in FIG. 1), and negative features 316 may include pits. For example, as shown in FIG. 3B, positive features 318 may include counterposed or 'pinching' pairs of positive features that mechanically couple to associated pairs of negative features. Moreover, mechanical coupling by a given counterposed pair of positive features may involve equal and opposite forces provided by the given counterposed pair of positive features in a plane of surface 312-1. More generally, positive features 318 may include protrusions or claw grippers, such as: a half-hemisphere, a hook, a square, etc. Similarly, negative features 316 may include: a groove an undercut ledge, etc.

Note that the mechanical coupling of substrates 310 and 314 may be remateable. For example, the mechanical coupling of substrates 310 and 314 may be released by re-compressing MCM 300 so that surfaces 312 are pushed toward each other a second time. Thus, positive features 318 and negative features 316 may be designed to mechanically 'clip and unclip' from each other without the use of an adhesive or an external clamp (i.e., a clamp or locking mechanism that is external to MCM 300).

The components in MCM 300 may be compatible with wafer-level batch processing and a pick-and-place assembly technique for engaging and disengaging positive features 318 and negative features 316. For example, positive features 318 may be defined using a plating operation (which deposits a stressed metal layer on surface 312-2), followed by removal of a sacrificial layer, for example, using a wet-etch operation. Similarly, negative features 316 may be fabricated by adding or removing material from surface 312-1, for example, using: plating, sputtering, and/or etching operations.

In addition to providing mechanical coupling, in some embodiments positive features 318 and negative features 316 also electrically couple substrates 310 and 314 (i.e., these features may serve dual functions). These dual function features may offer a small footprint on substrate 310 and 314. Furthermore, in these embodiments, the 'snap-fit' alignment provided by positive features 318 and negative features 316 may be sufficient for first-level interconnects.

Note that positive features 318 and negative features 316 may be designed based on factors, such as: the chip size, input/output pad locations, chip thickness, chip warpage, etc. In general, these self-locking features may have: a symmetric layout (with pairs of counterposed positive features); tolerance of variations in the micro-spring lengths and the pit locations; and tolerance of misalignment during the pick-and-place assembly technique.

Figure 4A:
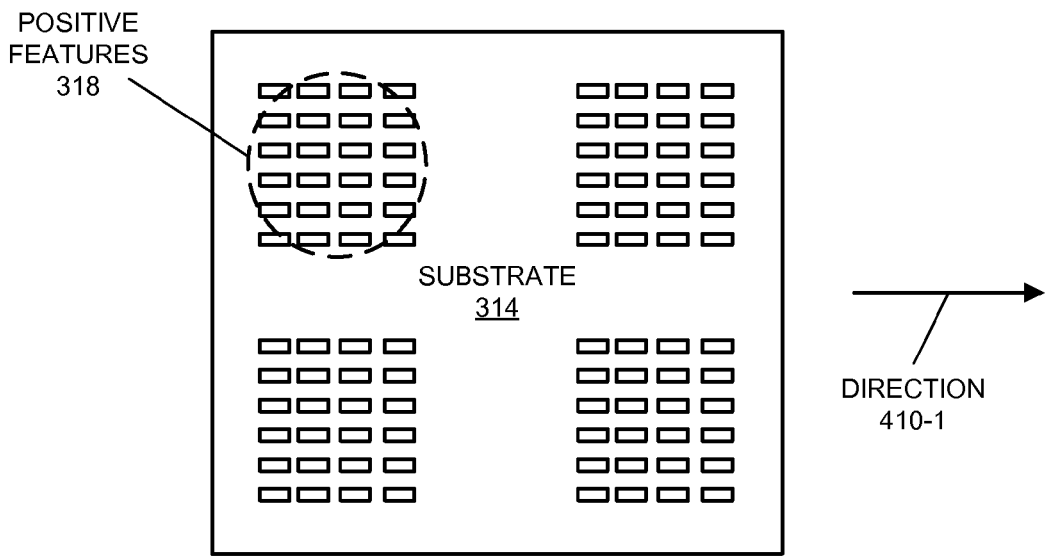
FIG. 4A is a block diagram illustrating feature orientations on a substrate in the MCM of FIGS. 3A and 3B in accordance with an embodiment of the present disclosure.
Figure 4B:
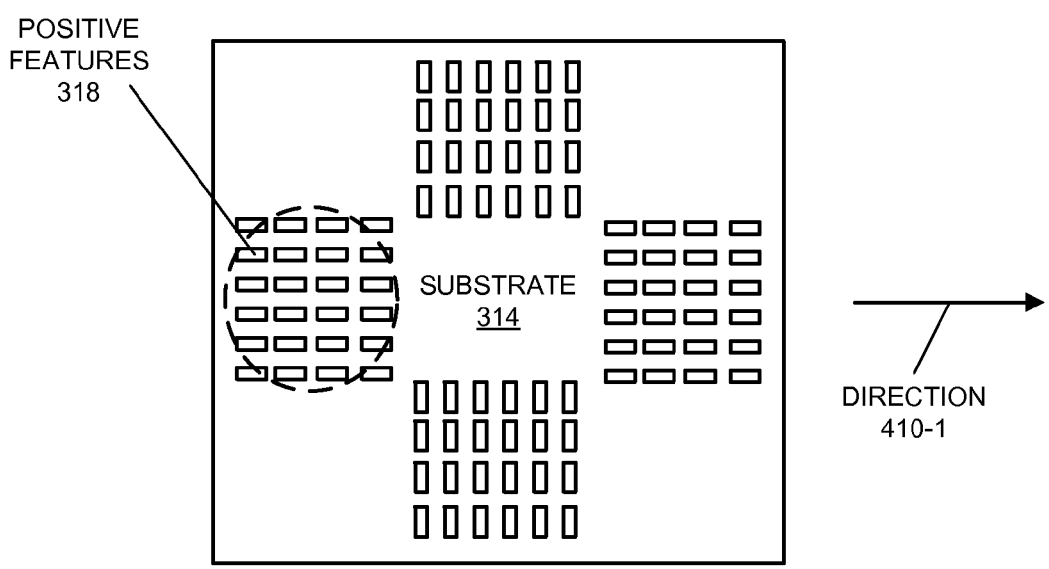
FIG. 4B is a block diagram illustrating feature orientations on a substrate in the MCM of FIGS. 3A and 3B in accordance with an embodiment of the present disclosure.
Figure 4C:
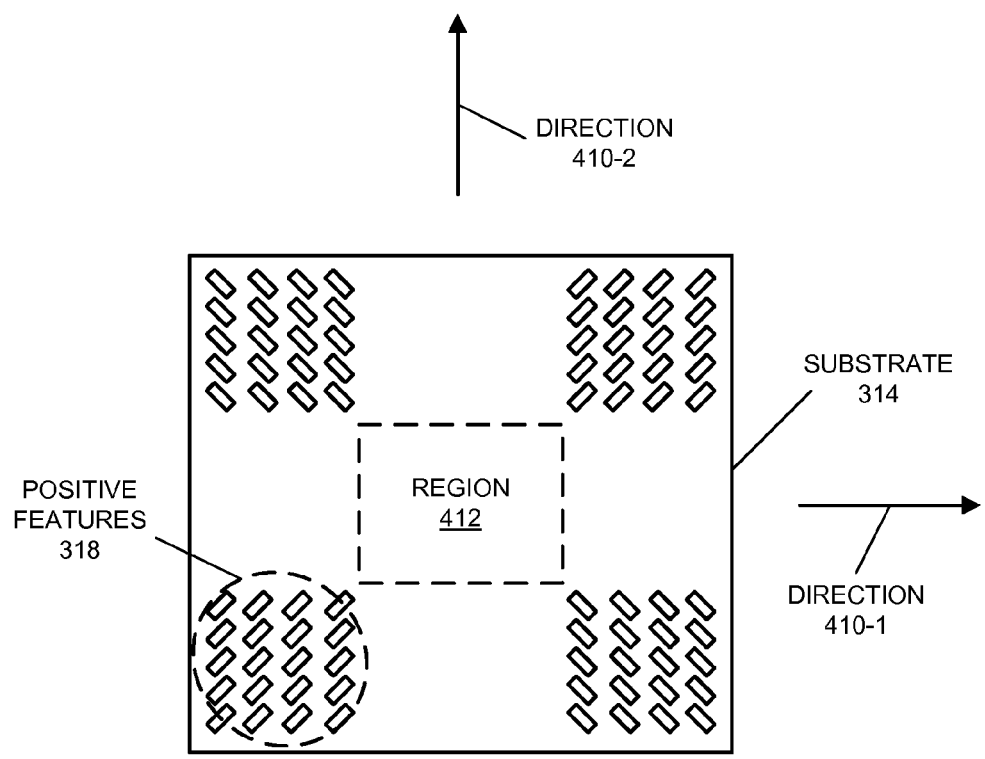
FIG. 4C is a block diagram illustrating feature orientations on a substrate in the MCM of FIGS. 3A and 3B in accordance with an embodiment of the present disclosure.

As shown in FIGS. 4A-4C, positive features 318 may be positioned on surface 312-2 in a variety of configurations, including: a symmetrical layout; a unidirectional layout with positive features 318 oriented along direction 410-1 (FIG. 4A); a perpendicular or normal layout with positive features 318 oriented along directions 410 (FIG. 4B); and/or a radial layout with positive features 318 oriented along radial directions (FIG. 4C) (such as a vector combination of directions 410), which radiate out from region 412 (FIG. 4C). Note that symmetrical configurations provide balanced gripping forces over the array of positive features 318. In addition, the strength requirement of an individual positive feature may be reduced or minimized because the total gripping force is provided (on average) by multiple positive features 318.

Figure 5A:
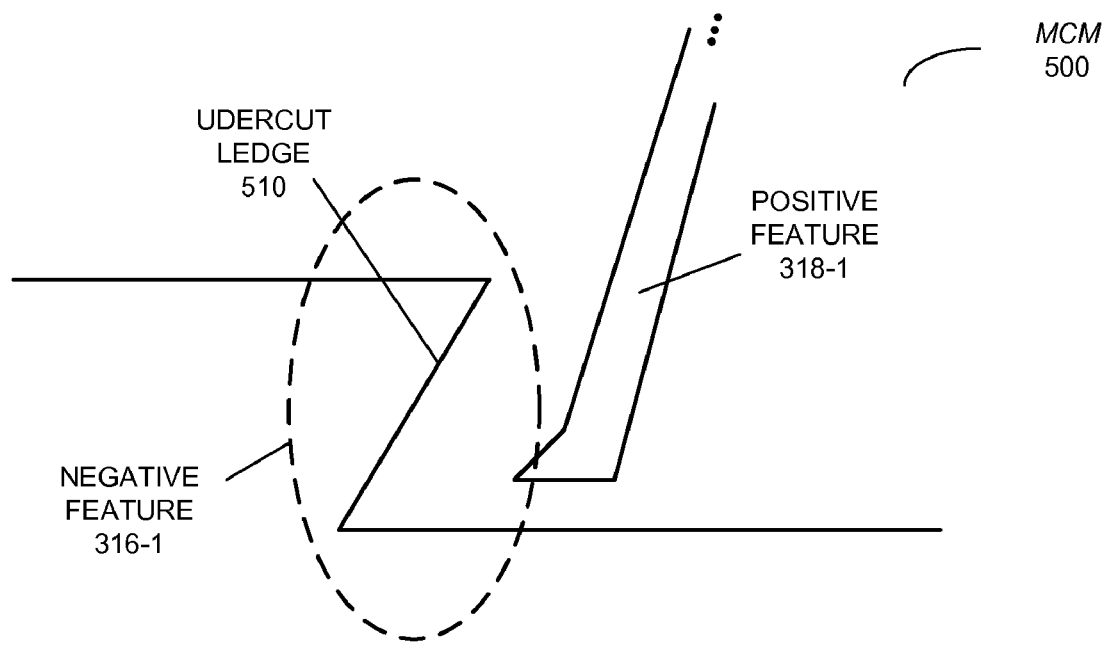
FIG. 5A is a block diagram illustrating an MCM in accordance with an embodiment of the present disclosure.

In some embodiments, negative features 316 (FIGS. 3A and 3B) have a near-vertical sidewall groove. However, as shown in FIG. 5A, which presents a block diagram illustrating MCM 500, in some embodiments negative features (such as negative feature 316-1) are fabricated with an undercut shape. For example, undercut ledge 510 can be metal on silicon and/or silicon dioxide, and the undercut can be fabricated using a subtractive process (such as etching) and/or an additive process (such as plating).

Figure 5B:
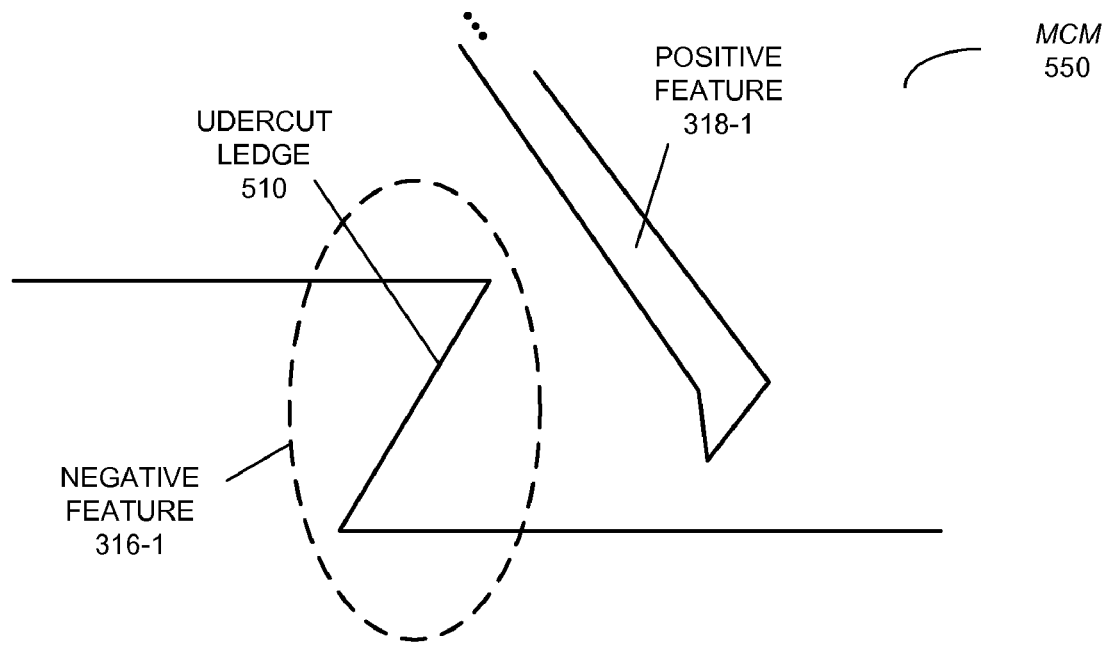
FIG. 5B is a block diagram illustrating an MCM in accordance with an embodiment of the present disclosure.

Furthermore, as shown in FIG. 5B, which presents a block diagram illustrating MCM 550, in some embodiments positive features (such as positive feature 318-1) and negative features (such as negative feature 316-1) provide remateability and self-locking, but may only require external force on substrates 310 and 314 (FIGS. 3A and 3B) when aligning these features. In particular, an external compression force deflects positive feature 318-1 and causes it to slide over surface 312-1 (FIGS. 3A and 3B). When the external force is removed, the stress-gradient in positive feature 318-1 pulls it back towards its rest or neutral position, thereby locking it in place against undercut negative feature 316-1. Subsequently, if the external force is applied again, substrate 314 (FIGS. 3A and 3B) can be removed from MCM 550, for example, by tilting substrate 314 (FIGS. 3A and 3B) at a small angle so that positive features (such as positive feature 318-1) do not self-lock with negative features (such as negative feature 316-1).

Figure 6:
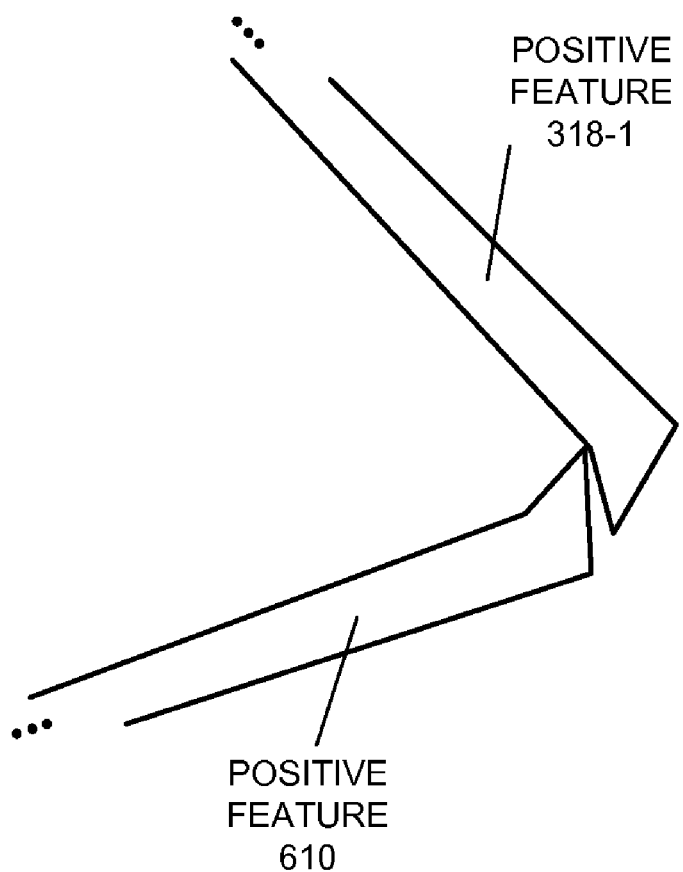
FIG. 6 is a block diagram illustrating an MCM in accordance with an embodiment of the present disclosure.

In some embodiments, each of surfaces 312 (FIGS. 3A and 3B) includes positive features. This is shown in FIG. 6, which presents a block diagram illustrating an MCM 600. Positive features (such as positive feature 610) disposed on surface 312-1 (FIGS. 3A and 3B) may only be partially released. For example, positive feature 610 may be released after mating with positive feature 318-1. Consequently, the out-of-plane movement of these positive features may be constrained, thus giving these positive features less flexibility. This metal positive-feature-to-positive-feature interconnect may have lower resistance than the interconnects in MCM 300 (FIGS. 3A and 3B).

Figure 7A:
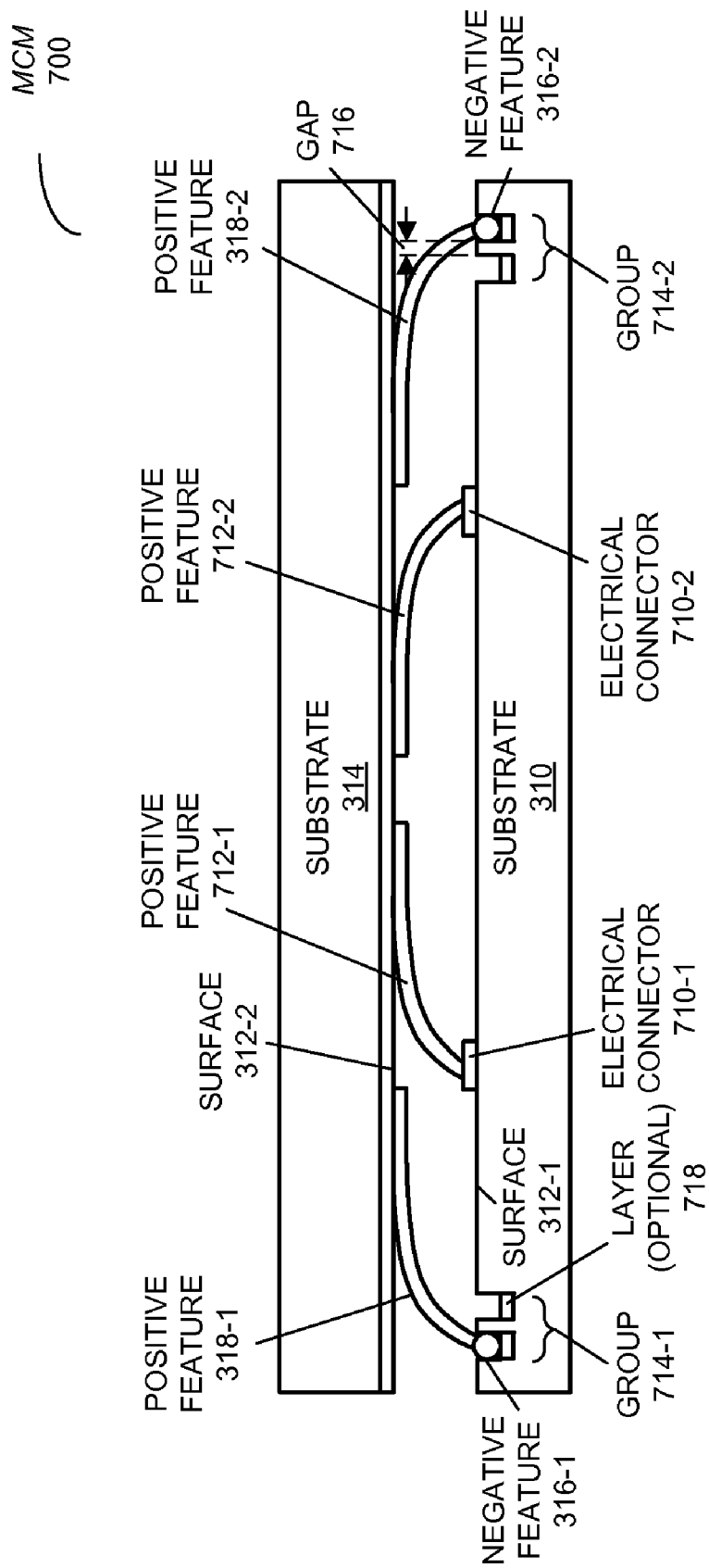
FIG. 7A is a block diagram illustrating an MCM in accordance with an embodiment of the present disclosure.
Figure 7B:
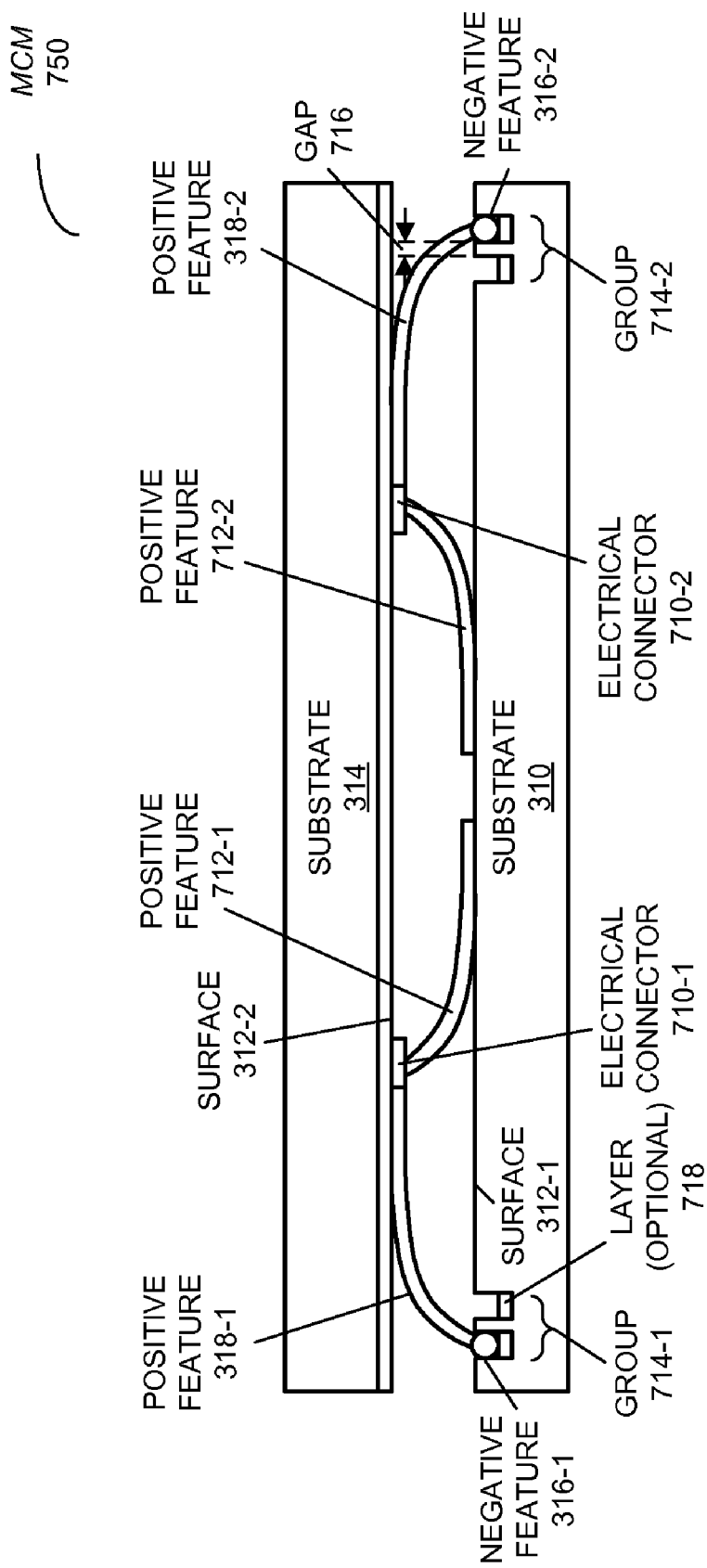
FIG. 7B is a block diagram illustrating an MCM in accordance with an embodiment of the present disclosure.

In some embodiments, electrical coupling is provided by separate features than those that provide the mechanical coupling (which may be strategically placed to self-lock substrates 310 and 314 in FIGS. 3A and 3B to each other). This is shown in FIG. 7, which presents a block diagram illustrating an MCM 700. In this MCM, surface 312-1 of substrate 310 includes electrical connectors 710, and surface 312-2 of substrate 314 includes positive features 712 that may contact electrical connectors 710, thereby electrically coupling substrates 310 and 314. For example, electrical connectors 710 and positive features 712 may provide: power, ground, and/or signal input/output interconnects. As shown in FIG. 7B, which presents a block diagram illustrating an MCM 750, in some embodiments electrical connectors 710 are disposed on substrate 314 and positive features 712 may be disposed on substrate 310. Furthermore, in some embodiments electrical connectors 710 and positive features 712 are disposed on both surfaces 312.

Note that positive features 318, which provide the mechanical coupling, may have wider mechanical springs than positive features 712 to provide increased mechanical strength. In addition, positive features 712 may not have 'grippers' on their tips (which are used by positive features 318 to self-lock to negative features 316), thereby mitigating potential contact problems in the electrical interconnects.

In order to address small variations in the heights of positive features 318 and in the depth negative features 316, groups 714 of negative features (which each include two or more negative features 316) may be disposed on surface 312-1. If a given positive feature (such as positive feature 318-1) is within an alignment tolerance, it may mate and self-lock with a first negative feature (such as negative feature 316-1) in a given group (such as group 714-1). However, if the misalignment is larger than a gap width (such as gap 716), positive feature 318-1 may mate and self-lock with a second negative feature in group 714-1. Consequently, this double (or multiple) negative feature 316 design in groups 714 may accommodate larger process variations (and the resulting misalignment) without extra process operations.

While the preceding embodiments have described remateable mechanical coupling, in some embodiments the mechanical coupling is not remateable. For example, at least some of negative features 316 may include a mechanically compliant material (such as in optional layer 718) having a bulk modulus less than a predefined value (for example, optional layer 718 may include a polymer or a soft metal). This mechanically compliant material may facilitate rigid mechanical coupling of substrates 310 and 314. In particular, when tips of positive features 318 engage or mate with the optional layers in negative features 316, the tips may become at least partially embedded in the mechanically compliant material.

Figure 8:
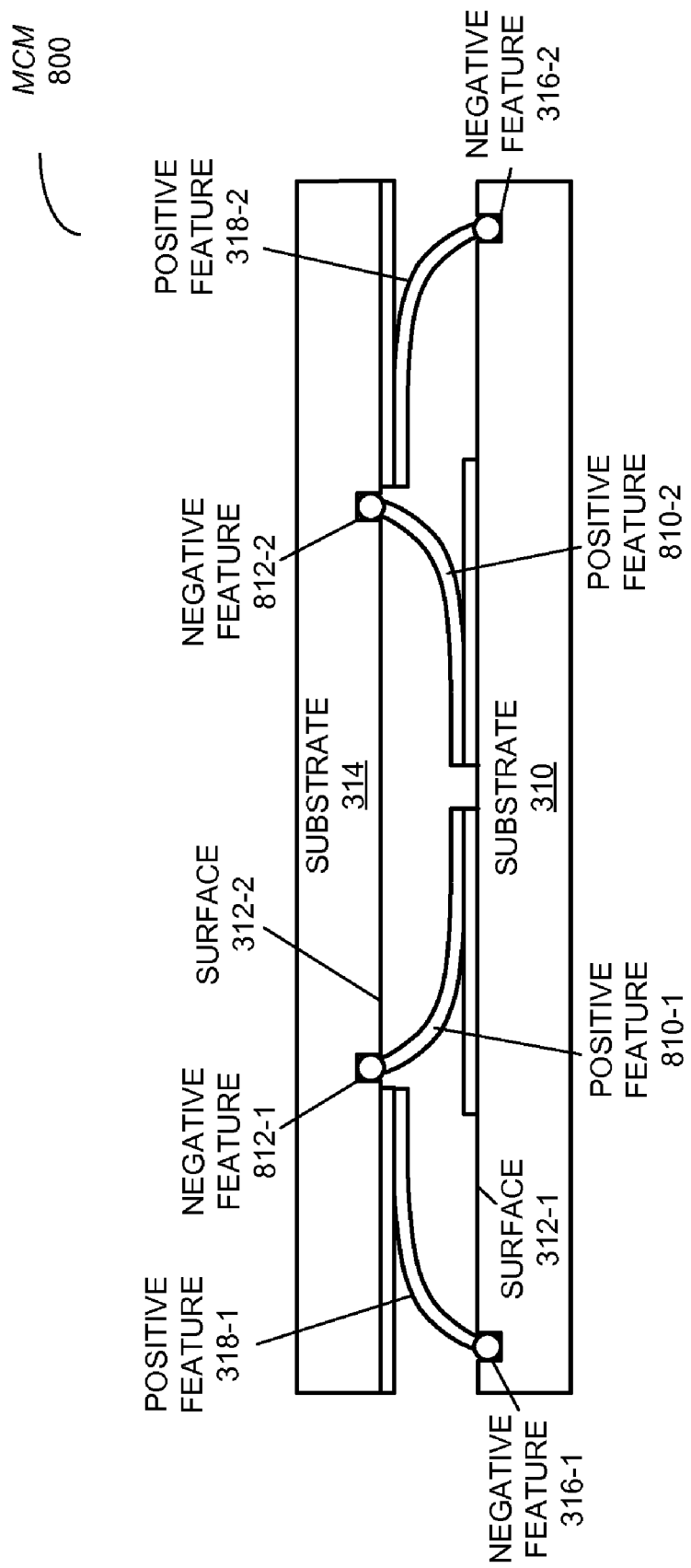
FIG. 8 is a block diagram illustrating an MCM in accordance with an embodiment of the present disclosure.

Furthermore, while the preceding embodiments illustrated positive features 318 on surface 312-2 of substrate 314, and negative features 316 on surface 312-1 of substrate 310, in other embodiments positive features and negative features may be disposed on each of substrates 310 and 314. This is shown in FIG. 8, which presents a block diagram illustrating an MCM 800. In this MCM, negative features 316 and positive features 810 are disposed on substrate 310, and positive features 318 and negative features 812 are disposed on substrate 314.

In an exemplary embodiment, positive features 318 (such as 'claws') on a package or carrier substrate are used to mate and self-lock to negative features 316, such as grooves, on a chip in an MCM. These grooves may be fabricated by: depositing aluminum or copper pads on the chip. Then, a seed layer is deposited on the pads and a photo-resist pattern may be defined over the seed layer using a photolithographic technique. Next, copper may be electroplated on the patterned seed layer to build up the grooves on the pads. Subsequently, the seed layer may be etched, and the resist layer may be stripped.

In another exemplary embodiment, positive features 318 on a chip are used to mate and self-lock to negative features 316, such as unfilled plated-through holes (PTHs), on a carrier substrate in an MCM. Note that PTHs are standard structures that can be fabricated in carrier substrates without special processing.

Figure 9:
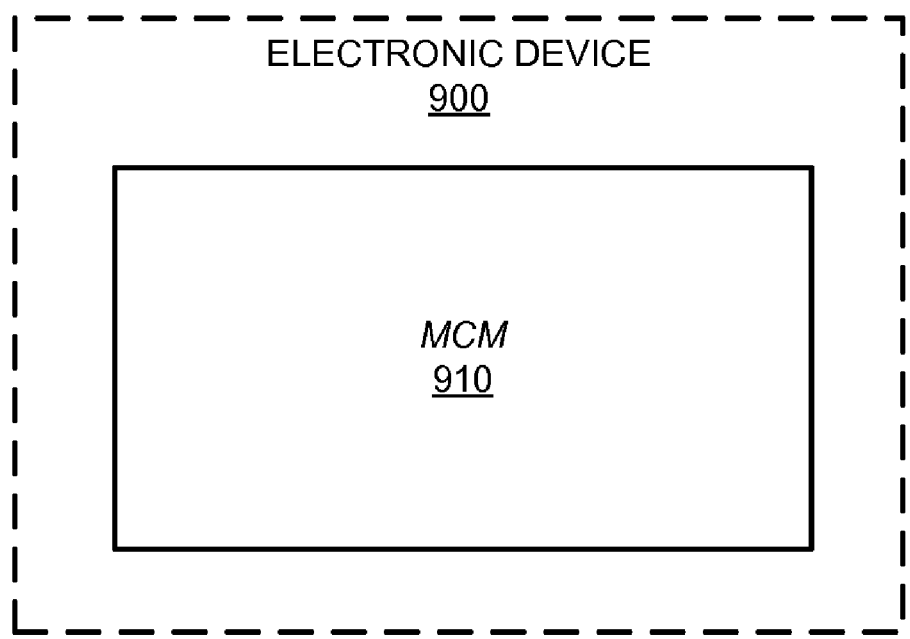
FIG. 9 is a block diagram illustrating an electronic device in accordance with an embodiment of the present disclosure.

One or more of the preceding embodiments of the MCM may be included in a system and/or an electronic device. This is shown in FIG. 9, which presents a block diagram illustrating an electronic device 900 that includes MCM 910. In general, an MCM may include an array of chip modules (CMs) or single-chip modules (SCMs), and a given SCM may include at least one substrate, such as a semiconductor die. Note that an MCM is sometimes referred to as a 'macro-chip.' Furthermore, the substrate may communicate with other substrates, CMs and/or SCMs in the MCM using proximity communication of electromagnetically coupled signals (which is referred to as 'electromagnetic proximity communication'). For example, the proximity communication may include: communication of capacitively coupled signals (electrical proximity communication') and/or communication of optical signals (such as 'optical proximity communication'). In some embodiments, the electromagnetic proximity communication includes inductively coupled signals and/or conductively coupled signals.

Furthermore, embodiments of the MCM may be used in a variety of applications, including: VLSI circuits, communication systems (such as in wavelength division multiplexing), storage area networks, data centers, networks (such as local area networks), and/or computer systems (such as multiple-core processor computer systems). For example, the MCM may be included in a backplane that is coupled to multiple processor blades, or the MCM may couple different types of components (such as processors, memory, input/output devices, and/or peripheral devices). In some embodiments, the MCM performs the functions of: a switch, a hub, a bridge, and/or a router.

Note that electronic device 900 may include, but is not limited to: a server, a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Moreover, note that a given computer system may be at one location or may be distributed over multiple, geographically dispersed locations.

MCMs in FIGS. 3A-8 and/or electronic device 900 may include fewer components or additional components. For example, negative features 316 (FIG. 3A) may be defined in layers that are deposited on surface 312-1 (FIG. 3A), and these negative features may be recessed below a surface of the top layer deposited on substrate 310 (FIG. 3A). Similarly, positive features 318 (FIG. 3A) may protrude above a local surface, which may be surface 312-2 (FIG. 3A) or a surface of a top layer deposited on substrate 314 (FIG. 3A). Thus, in the preceding embodiments a surface of a substrate should be understood to include a surface of a layer deposited on the substrate or a surface of the substrate itself.

Furthermore, although these embodiments are illustrated as having a number of discrete items, these MCMs and electronic devices are intended to be functional descriptions of the various features that may be present rather than structural schematics of the embodiments described herein. Consequently, in these embodiments two or more components may be combined into a single component, and/or a position of one or more components may be changed.

Note that positive features 318 (such as in FIG. 3A) and/or negative features 316 (such as in FIG. 3B) may be defined using an additive process (i.e., a material-deposition) and/or a subtractive process (i.e., a material-removal). For example, the process may include: sputtering, isotropic etching, anisotropic etching, photolithographic technique and/or a direct-write technique. Additionally, these features may be fabricated using a wide variety of materials, including: a semiconductor, metal, glass, sapphire, and/or silicon dioxide.

We now describe embodiments of a process. FIG. 10 presents a flow chart illustrating a process 1000 for fabricating an MCM, such as MCM 300 (FIGS. 3A and 3B). During this process, first negative features are defined on a first surface of a first substrate (operation 1010), where a given first negative feature is recessed below the first surface and has an opening, defined by an edge. Then, first positive features are defined on a second surface of a second substrate (operation 1012), where a given first positive feature protrudes above the second surface, and where the first positive features are configured to mate and self-lock with the first negative features. Next, the first substrate is mechanically coupled to the second substrate in the MCM by positioning the first substrate and the second substrate so that the first surface faces the second surface, and by compressing the MCM so that the first surface and the second surface are pushed toward each other, and the first positive features mate and self-lock with associated first negative features (operation 1014).

In some embodiments of process 1000, there are additional or fewer operations. Moreover, the order of the operations may be changed, and/or two or more operations may be combined into a single operation.

The foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art. Additionally, the above disclosure is not intended to limit the present disclosure. The scope of the present disclosure is defined by the appended claims.

What is claimed is:

1. A multi-chip module (MCM), comprising:
   a first substrate having a first surface, wherein the first substrate includes first negative features disposed on the first surface, and wherein a given first negative feature is recessed below the first surface and has an opening, defined by an edge; and
   a second substrate having a second surface that faces the first surface, wherein the second substrate includes first positive features disposed on the second surface;
   wherein a given first positive feature protrudes above the second surface; and
   wherein the first positive features are configured to mate and self-lock with the first negative features, thereby mechanically coupling the first substrate and the second substrate,
   wherein the mechanical coupling of the first substrate and the second substrate is remateable and is released by compressing the MCM so that the first surface and the second surface are pushed toward each other.

2. The MCM of claim 1, wherein the first positive features include micro-spring connectors.

3. The MCM of claim 1, wherein the first positive features include counterposed pairs of first positive features that mechanically couple to associated pairs of first negative features; and
   wherein mechanical coupling by a given counterposed pair of first positive features involves a force provided by the given counterposed pair of first positive features in a plane of the first surface.

4. The MCM of claim 1, wherein the first negative features include pits.

5. The MCM of claim 1, wherein the first positive features and the first negative features electrically couple the first substrate and the second substrate.

6. The MCM of claim 1, wherein the first substrate includes electrical connectors disposed on the first surface;
   wherein the second substrate includes second positive features disposed on the second surface;
   wherein a given second positive feature protrudes above the second surface; and
   wherein the second positive features are configured to contact the electrical connectors, thereby electrically coupling the first substrate and the second substrate.

7. The MCM of claim 1, wherein the second substrate includes electrical connectors disposed on the second surface;
   wherein the first substrate includes second positive features disposed on the first surface;
   wherein a given second positive feature protrudes above the first surface; and
   wherein the second positive features are configured to contact the electrical connectors, thereby electrically coupling the first substrate and the second substrate.

8. The MCM of claim 1, wherein the first negative features are arranged in groups, which include two or more first negative features;
   wherein the first positive features are associated with the groups; and
   wherein the mechanical coupling involves mating and self-locking of the given first positive feature with one of the two or more first negative features in a given group, thereby accommodating process variation and misalignment in the MCM.

9. The MCM of claim 1, wherein symmetry directions of the first positive features are arranged along a first direction in the plane of the second surface.

10. The MCM of claim 1, wherein symmetry directions of the first positive features are arranged along a first direction and a second direction in the plane of the second surface; and
    wherein the first direction and the second direction are approximately perpendicular.

11. The MCM of claim 1, wherein symmetry directions of the first positive features are arranged in radial directions in the plane of the second surface; and
    wherein the radial directions radiate out from a common point or region on the second surface.

12. The MCM of claim 1, wherein the given first negative feature includes an undercut of the first surface.

13. The MCM of claim 1, wherein the first substrate includes second positive features disposed on the first surface, wherein a given second positive feature protrudes above the first surface;
    wherein the second substrate includes second negative features disposed on the second surface, wherein a given second negative feature is recessed below the second surface and has an opening, defined by an edge; and
    wherein the second positive features are associated with the second negative features, and are configured to mate and self-lock with the second negative features, thereby mechanically coupling the first substrate and the second substrate.

14. An electronic device, comprising an MCM, wherein the MCM includes:
    a first substrate having a first surface, wherein the first substrate includes first negative features disposed on the first surface, and wherein a given first negative feature is recessed below the first surface and has an opening, defined by an edge; and a second substrate having a second surface that faces the first surface, wherein the second substrate includes first positive features disposed on the second surface;

wherein a given first positive feature protrudes above the second surface; and wherein the first positive features are configured to mate and self-lock with the first negative features, thereby mechanically coupling the first substrate and the second substrate, wherein the mechanical coupling of the first substrate and the second substrate is remateable and is released by compressing the MCM so that the first surface and the second surface are pushed toward each other.

15. A multi-chip module (MCM), comprising:

a first substrate having a first surface, wherein the first substrate includes first negative features disposed on the first surface, and wherein a given first negative feature is recessed below the first surface and has an opening, defined by an edge; and a second substrate having a second surface that faces the first surface, wherein the second substrate includes first positive features disposed on the second surface;

wherein a given first positive feature protrudes above the second surface; and wherein the first positive features are configured to mate and self-lock with the first negative features, thereby mechanically coupling the first substrate and the second, wherein the first negative features include a mechanically compliant material that facilitates the mechanical coupling, and wherein, when the first positive features mate with the first negative features, tips of the first positive features become at least partially embedded in the mechanically compliant material.

16. The MCM of claim 15, wherein the mechanically compliant material includes a polymer.

17. The MCM of claim 15, wherein the mechanically compliant material facilitates rigid mechanical coupling of the first substrate and the second substrate.

* * * * *